United States Patent [19]

Matsumoto et al.

[11] Patent Number: 5,357,477
[45] Date of Patent: Oct. 18, 1994

[54] SEMICONDUCTOR MEMORY HAVING MULTIPLE DATA I/O WITH BIT ALIGNED ACCESS FUNCTION

[75] Inventors: Akihiro Matsumoto; Hideo Nishimatsu, both of Osaka, Japan

[73] Assignee: Matsushita Electric Industrial Co., Ltd., Osaka, Japan

[21] Appl. No.: 884,449

[22] Filed: May 18, 1992

[51] Int. Cl.$^5$ .................................................. G11C 8/00
[52] U.S. Cl. .......................... 365/230.02; 365/230.06; 365/238.5
[58] Field of Search ........... 365/238.5, 189.02, 230.06, 365/230.02

[56] References Cited

U.S. PATENT DOCUMENTS

| | | | |
|---|---|---|---|
| 4,599,709 | 7/1986 | Clemons | 365/238.5 |
| 4,764,901 | 8/1988 | Sakurai | 365/230.02 |
| 4,896,301 | 1/1990 | Ogawa | 365/189.02 |
| 4,941,129 | 7/1990 | Oshima et al. | 365/230.02 |
| 5,040,152 | 8/1991 | Voss et al. | 365/230.02 |
| 5,173,878 | 12/1992 | Sakui et al. | 365/230.02 |

*Primary Examiner*—Eugene R. LaRoche
*Assistant Examiner*—Christopher R. Glenbocki
*Attorney, Agent, or Firm*—Lowe, Price, LeBlanc & Becker

[57] ABSTRACT

A memory includes a memory cell array unit, a plurality of memory cell bit lines connected to the memory cell array unit, a plurality of column selecting gates, and a plurality of sub data lines connected to the memory cell bit lines via the column selecting gates. A column selector serves to select and make conductive members of the column selecting gates so that data can be transmitted between successive members of the memory cell bit lines and the sub data lines. The memory further includes N-bit main data lines, where N denotes a given natural number. In addition, the memory includes data line selecting gates. The sub data lines are connected to the main data lines via the data line selecting gates. A data line selector serves to select and make conductive members of the data line selecting gates so that data can be transmitted between N successive members of the sub data lines and the main data lines.

4 Claims, 9 Drawing Sheets

SEMICONDUCTOR MEMORY HAVING MULTIPLE DATA I/O WITH BIT ALIGNED ACCESS FUNCTION

BACKGROUND OF THE INVENTION

This invention relates to a memory having a bit block transfer function.

In computer graphics, hardware designed exclusively for image data processing enables a higher speed of image data processing than the speed of image data processing executed by a combination of software and a processor unit. Recently, there has been a trend toward the use of hardware instead of a software technique in image data processing.

Frame memories having a bit block transfer function are often used in image data processing systems. According to an example of image data processing which uses a bit block transfer function, first image data is read out from a certain rectangular region of a frame memory, and given logic operation is executed between the first image data and externally-fed data to convert the first image data into second image data before the second image data is written into the same or another rectangular region of the frame memory.

As will be explained later, the speed of bit block transfer and related data processing in a prior art memory tends to be low.

SUMMARY OF THE INVENTION

It is an object of this invention to provide an improved memory having a bit block transfer function.

A first aspect of this invention provides a memory comprising a memory cell array unit; a plurality of memory cell bit lines connected to the memory cell array unit; a plurality of column selecting gates; a plurality of sub data lines connected to the memory cell bit lines via the column selecting gates; a column selector for selecting and making conductive members of the column selecting gates so that data can be transmitted between successive members of the memory cell bit lines and the sub data lines; N-bit main data lines, where N denotes a given natural number; data line selecting gates, wherein the sub data lines are connected to the main data lines via the data line selecting gates; and a data line selector for selecting and making conductive members of the data line selecting gates so that data can be transmitted between N successive members of the sub data lines and the main data lines.

A second aspect of this invention provides a memory comprising a memory cell array unit; a plurality of memory cell bit lines connected to the memory cell array unit; a plurality of column selecting gates; a plurality of sub data lines connected to the memory cell bit lines via the column selecting gates, wherein a number of the sub data lines is equal to twice N denoting a given natural number; a column selector for selecting and making conductive members of the column selecting gates so that data can be transmitted between 2N successive members of the memory cell bit lines and the sub data lines; N-bit main data lines, where N denotes a given natural number; data line selecting gates, a number of which is equal to $2N^2$, wherein the sub data lines are connected to the main data lines via the data line selecting gates; and a data line selector for selecting and making conductive members of the data line selecting gates so that data can be transmitted between N successive members of the sub data lines and the main data lines.

A third aspect of this invention provides a memory comprising a memory cell array unit; a plurality of memory cell bit lines connected to the memory cell array unit; a plurality of column selecting gates; a plurality of sub data lines connected to the memory cell bit lines via the column selecting gates, wherein a number of the sub data lines is equal to $(N \times 2 - 1)$, and N denotes a given natural number; a column selector for selecting and making conductive members of the column selecting gates so that data can be transmitted between $(N \times 2 - 1)$ successive members of the memory cell bit lines and the sub data lines; N-bit main data lines; data line selecting gates, wherein the sub data lines are connected to the main data lines via the data line selecting gates; and a data line selector for selecting and making conductive members of the data line selecting gates so that data can be transmitted between N successive members of the sub data lines and the main data lines.

A third aspect of this invention provides a memory comprising a memory cell array unit; a plurality of memory cell bit lines connected to the memory cell array unit, wherein a total number of the memory cell bit lines is equal to a given natural number; a plurality of sub data lines, wherein a total number of the sub data lines is equal to or smaller than the total number of the memory cell bit lines; means for selecting successive members of the memory cell bit lines, and for connecting the selected successive members of the memory cell bit lines and the sub data lines to enable transmission of data between the selected successive members of the memory cell bit lines and the sub data lines; a plurality of main data lines, wherein a total number of the main data lines is smaller than the total number of the sub data lines; and means for selecting successive members of the sub data lines, and for connecting the selected successive members of the sub data lines and the main data lines to enable transmission of data between the selected successive members of the sub data lines and the main data lines.

DESCRIPTION OF THE PRIOR ART

Figure 1:
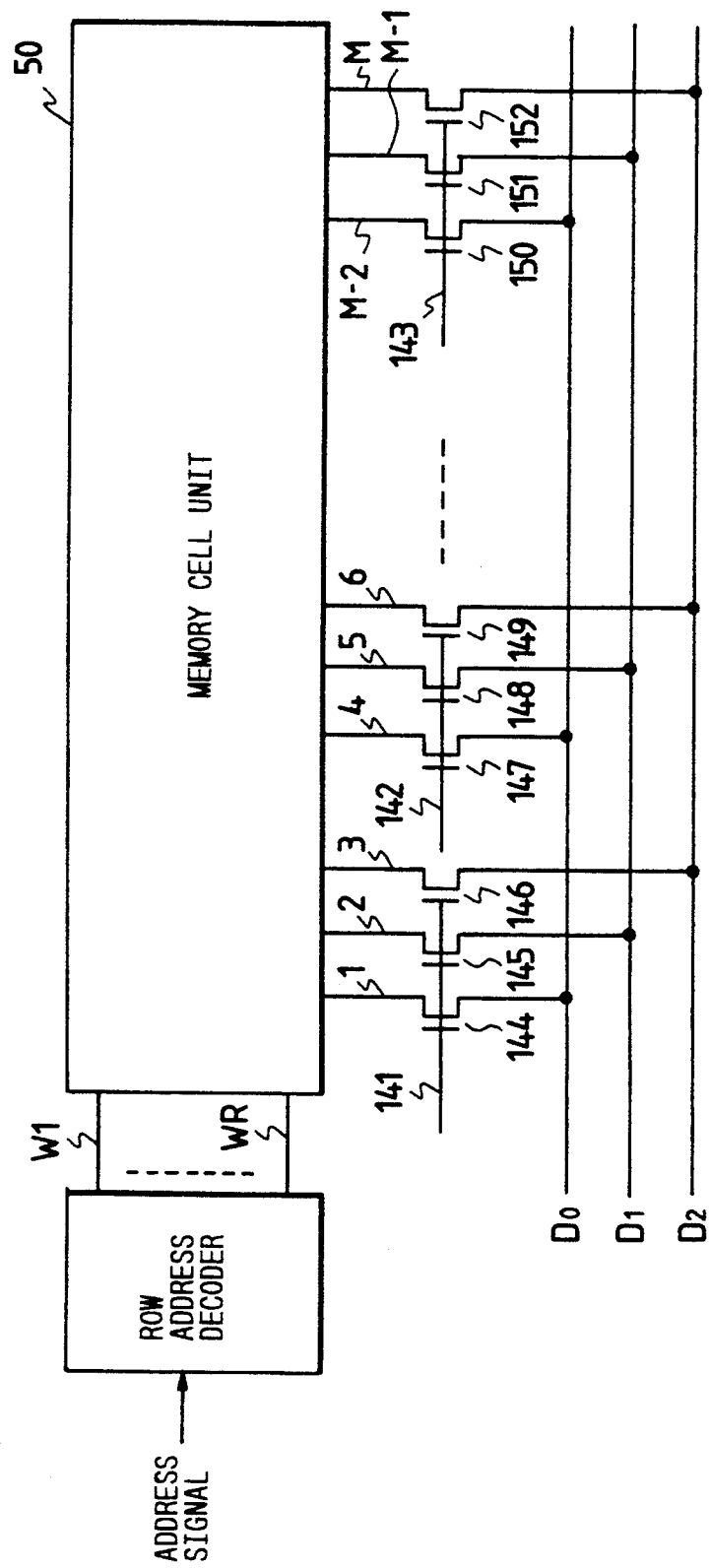
FIG. 1 is a diagram of a prior art memory.

With reference to FIG. 1, a prior art memory includes a memory cell unit 50 composed of an array of memory cells. Bit lines 1, 2, 3, ..., M−2, M−1, and M extend from the memory cell unit 50. The letter M denotes a preset natural number. Word lines W1, ..., WR extend between the memory cell unit 50 and a row address decoder 68. The letter R denotes a preset natural number. The bit lines 1, ..., M and the word lines W1, ..., WR are connected to the memory cells in the memory cell unit 50.

A multi-bit data line has three bits which correspond to bit data lines D0, D1, and D2 respectively. The bit lines 1, 4, ..., M−2 are connected to the bit data line D0 via column selecting gates 144, 147, ..., and 150. The bit lines 2, 5, ..., M−1 are connected to the bit data line D1 via column selecting gates 145, 148, ..., and 151. The bit lines 3, 6, ..., M are connected to the bit data line D2 via column selecting gates 146, 149, ..., and 152.

The column selecting gates 144, 145, and 146 are in a common group connected to a column selection line 141. The column selecting gates 147, 148, and 149 are in a common group connected to a column selection line 142. The column selecting gates 150, 151, and 152 are in a common group connected to a column selection line 143.

During access to memory cells in the memory cell unit 50, the row address decoder 68 selects and drives one of the word lines W1, ..., WR in accordance with a row address signal. Then, a column selector (not shown) selects and drives one of the column selection lines 141, 142, ..., and 143 in accordance with a column address signal so that three of the column selecting gates 144, 145, ..., and 152 which are connected to the driven column selection line are selected, and that three successive members of the bit lines 1, 2, ..., and M which are connected to the selected column selecting gates are also selected. As a result, access to memory cells within the memory cell unit 50 which are connected to the selected word line and the selected bit lines is executed.

Figure 2:
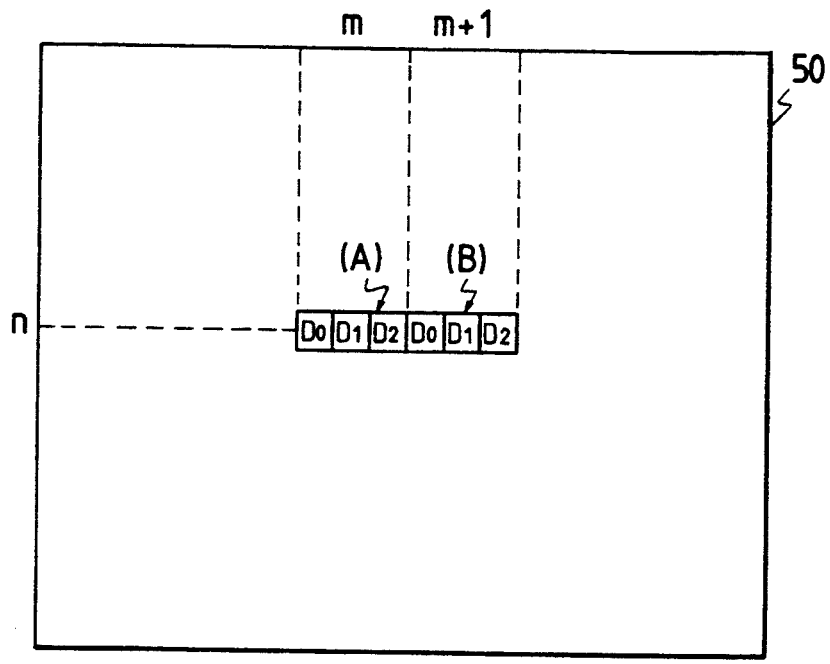
FIG. 2 is an address map of the memory cell unit in the prior art memory of FIG. 1.

With reference to FIG. 2, in the prior art memory, three bits in a storage segment or a bit bock (A) of the memory cell unit 50 are selected when the row address and the column address are "n" and "m" respectively. When the column address changes from "m" to "m+1" but the row address remains "n", three bits in a storage segment or a bit block (B) of the memory cell unit 50 which neighbors the storage segment (A) are selected.

Figure 3:
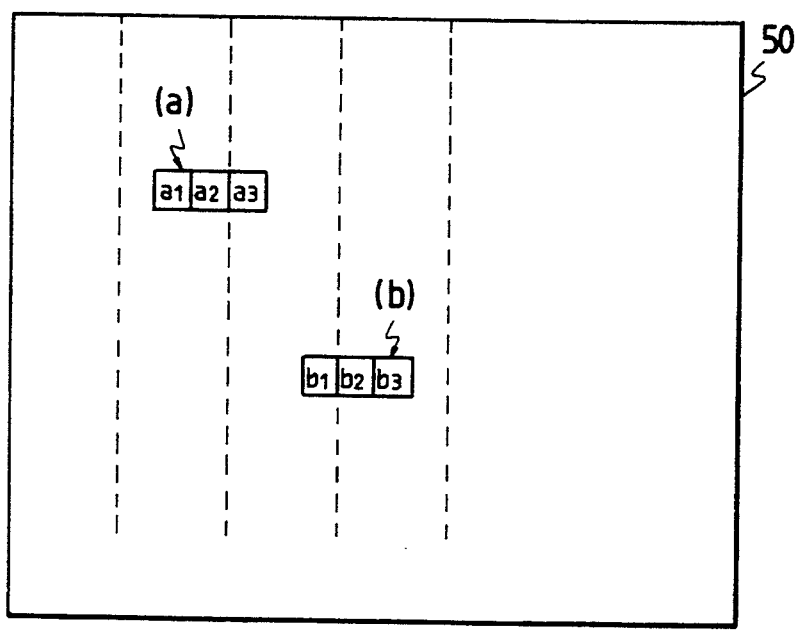
FIG. 3 is a diagram showing blocks in a memory cell unit which are subjected to bit block transfer.

A description will be given of a bit block transfer function of the prior art memory. As shown in FIG. 3, a block (a) within the memory cell unit 50 has three neighboring memory cells (first, second, and third memory cells) which store data a1, a2, and a3 respectively. In addition, a block (b) within the memory cell unit 50 has three neighboring memory cells (first, second, and third memory cells) which store data b1, b2, and b3 respectively. As understood from FIG. 1, the bit lines 1, ..., M are separated into groups each having three successive bit lines. The memory cells in the memory cell unit 50 are separated into groups in accordance with the separation of the bit lines 1, ..., M into groups. In FIG. 3, longitudinal broken lines denote the boundaries between the memory cell groups in the memory cell unit 50. It is now assumed that the memory cell group boundary extends between the second memory cell and the third memory cell in the block (a). In other words, it is now assumed that the data a1 and a2 can be simultaneously read out during a common column selection period but reading out the data a3 requires another column selection period and thus the data a1, a2, and a3 can not be simultaneously read out.

The bit block transfer function relating to the transfer of the data from and to the blocks (a) and (b) within the memory cell unit 50 is executed as follows. Firstly, the data a1 is read out from the first memory cell of the block (a) of the memory cell unit 50 and is transferred to the bit data line D1, and simultaneously the data a2 is read out from the second memory cell of the block (a) of the memory cell unit 50 and is transferred to the bit data line D2. Secondly, the data a1 on the bit data line D1 is subjected to a 1-bit shift by a suitable shifting device (not shown) so that the data a1 is transferred from the bit data line D1 to the bit data line D2, and simultaneously the data a2 on the bit data line D2 is subjected to a 1-bit shift by the shifting device so that the data a2 is transferred from the bit data line D2 to the bit data line D0. The data a1 and the data a2 are transferred to a processing section (not shown) and are held within the processing section. Thirdly, the data b1 is read out from the first memory cell of the block (b) of the memory cell unit 50 and is transferred to the bit data line D2. Given logic operation between the data b1 and the data a1 is executed by the processing section, and data c1 which results from the logic operation is written into the first memory cell of the block (b) of the memory cell unit 50. Then, the data a3 is read out from the third memory cell of the block (a) of the memory cell unit 50 and is transferred to the bit data line D0. The data a3 on the bit data line D0 is subjected to a 1-bit shift by the shifting device so that the data a3 is transferred from the bit data line D0 to the bit data line D1. The data a3 is transferred to the processing section and is held within the processing section. Subsequently, the data b2 is read out from the second memory cell of the block (b) of the memory cell unit 50 and is transferred to the bit data line D0, and simultaneously the data b3 is read out from the third memory cell of the block (b) of the memory cell unit 50 and is transferred to the bit data line D1. Given logic operation between the data b2 and the data a2 is executed by the processing section, and data c2 which results from the logic operation is written into the second memory cell of the block (b) of the memory cell unit 50. In addition, given logic operation between the data b3 and the data a3 is executed by the processing section, and data c3 which results from the logic operation is written into the third memory cell of the block (b) of the memory cell unit 50.

The above-mentioned prior art data processing which uses the bit block transfer function needs shifting the data read out from the memory and storing the data read out from the memory. Thus, the prior art data processing has a problem in data processing speed.

DESCRIPTION OF THE FIRST PREFERRED EMBODIMENT

Figure 4:
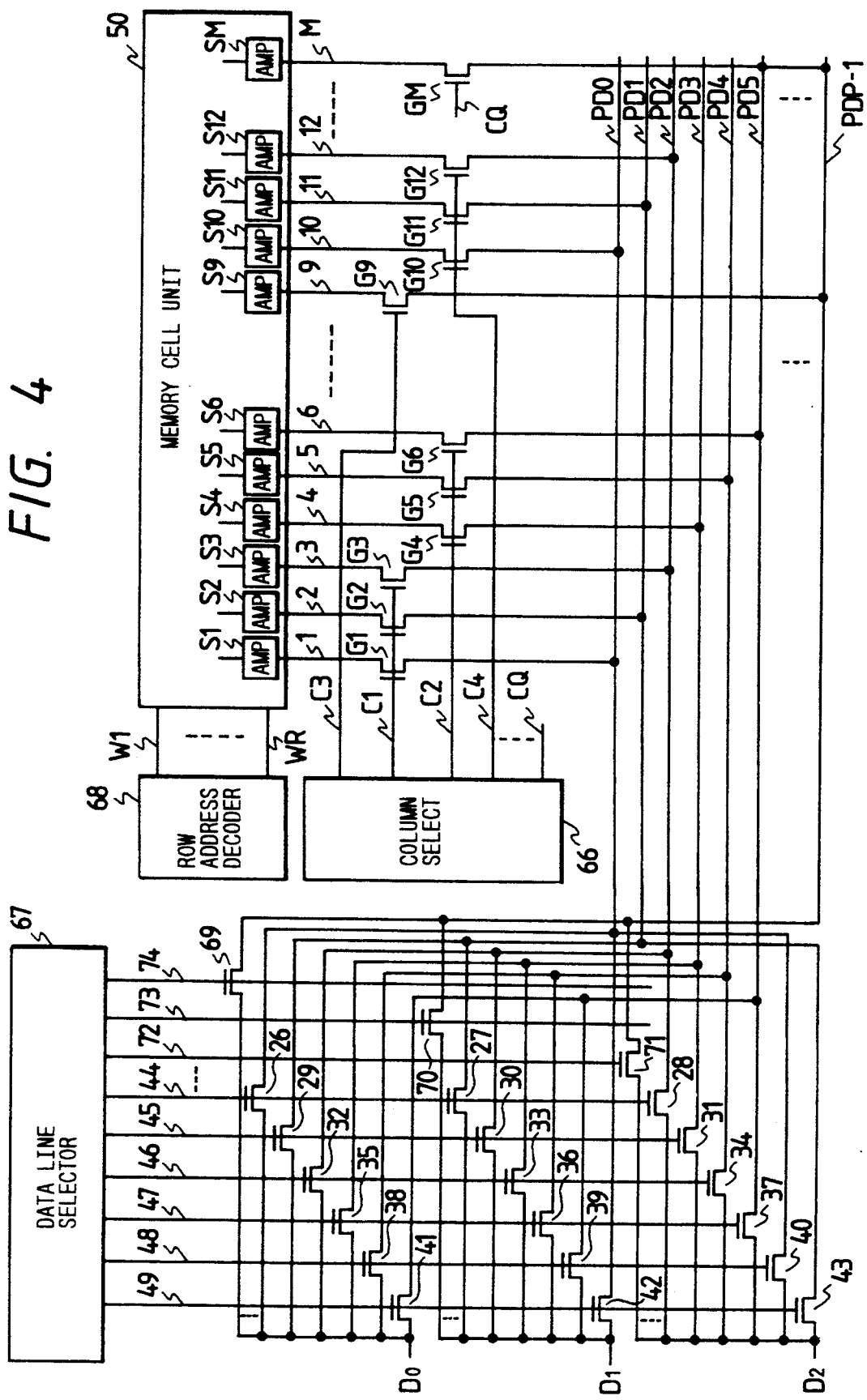
FIG. 4 is a diagram of a memory according to a first embodiment of this invention.

With reference to FIG. 4, a memory of a first embodiment of this invention includes a memory cell unit 50 composed of an array of memory cells and a set of sense amplifiers S1, S2, ..., SM. The letter M denotes a predetermined natural number. Bit lines 1, 2, ..., M extend from the sense amplifiers S1, S2, ..., SM in the memory cell unit 50 respectively. The bit lines 1, ..., M are connected to the memory cells in the memory cell unit 50 via the sense amplifiers S1, ..., SM. Word lines W1, ..., WR extend between the memory cell unit 50 and a row address decoder 68. The letter R denotes a preset natural number. The word lines W1, ..., WR are connected to the memory cells in the memory cell unit 50.

A multi-bit data line has three bits which correspond to main bit data lines D0, D1, and D2 respectively. There are sub bit data lines (pre-data lines) PD0, PD1, PD2, PD3, PD4, PD5, ..., and PDP−1, the number "P" of which has a given relation with the number of the main bit data lines D0, D1, and D2. The bit lines 1, 2, ..., M are connected to the sub bit data lines PD0, PD1, ..., PDP−1 via column selecting gates G1, G2, ..., GM.

The column selecting gates G1, G2, ..., GM are separated into groups each having three successive selecting gates and each being connected in common to a column selection line C1, C2, ..., or CQ which extends from a column selector 66. The letter Q denotes a predetermined natural number equal to one third of the number M. When "P/3" members of the column selection lines C1, ..., CQ are selected by the column selector 66 in response to a column address signal and thus members of the column selecting gates G1, ..., GM which are connected to the selected column selection lines are made conductive, "P" successive members of the bit lines 1, ..., M are operatively connected to the sub bit data lines PD0, ..., PDP−1. For example, when the column selection lines C1, C2, and C3 are selected by the column selector 66, the column selecting gates G1, G2, G3, ..., G9 are made conductive so that the bit lines 1, ..., 9 are operatively connected to the sub bit data lines PD0, ..., PDP−1 respectively.

The sub bit data lines PD0, ..., PDP−1 are connected to the main bit data lines D0, D1, and D3 via data line selecting gates 26–43 and 69–71. There are lines 44–49 and 72–74 each connected to three members of the data line selecting gates 26–43 and 69–71. The lines 44–49 and 72–74 extend from a data line selector 67. When one of the lines 44–49 and 72–74 is selected by the data line selector 67 in response to a column address signal and thus three members of the data line selecting gates 26–43 and 69–71 which are connected to the selected line are made conductive, three successive members of the sub bit data lines PD0, ..., PDP−1 are operatively connected to the main bit data lines D0, D1, and D3. For example, when the line 44 is selected by the data line selector 67, the data line selecting gates 26, 27, and 28 are made conductive so that the sub bit data lines PD0, PD1, and PD2 are operatively connected to the main bit data lines D0, D1, and D2 respectively.

The memory of FIG. 4 operates as follows. Firstly, the row address decoder 68 selects and activates one of the word lines W1, ..., WR in accordance with a row address signal. Thus, memory cells within the memory cell unit 50 which are provided on the selected word line are operatively connected to the bit lines 1, ..., M respectively. In addition, the column selector 66 selects and activates, for example, the column selection lines C1, C2, and C3 in accordance with a column address signal so that the column selecting gates G1, G2, G3, ..., G9 are made conductive. Thus, the bit lines 1, 2, 3, ..., 9 are operatively connected to the sub bit data lines PD0, PD1, PD2, ..., PDP−1 respectively. In this way, "P" successive members of the bit lines 1, ..., M are operatively connected to the sub bit data lines PD0, ..., PDP−1. The data line selector 67 selects and activates one of the lines 44–49 and 72–74 in accordance with a column address signal, so that three of the data line selecting gates 26–43 and 69–71 which are connected to the selected line are made conductive. Thus, three successive members of the sub bit data lines PD0, PD1, PD2, ..., PDP−1 are operatively connected to the main bit data lines D0, D1, and D2 via the conductive data line selecting gates. As a result, the main bit data lines D0, D1, and D3 are operatively connected to three successive memory cells within the memory cell unit 50, and access to these memory cells via the data lines D0, D1, and D3 is enabled.

The number of the main bit data lines may be different from three as will be explained hereinafter. A modification of the memory of FIG. 4 has main bit data lines, the number of which is equal to a predetermined natural number N. In this modification, there are sub bit data lines, the number of which is equal to 2N. In addition, bit lines are connected to the sub bit data lines via column selecting gates. Each of column selection lines are connected in common to three successive members of the column selecting gates. When two successive members of the column selection lines are selected by a column selector, "2N" successive memory cells are operatively connected to the sub bit data lines. The sub bit data lines are connected to the "N" main bit data lines via data line selecting gates. Each of lines extending from a data line selector is connected in common to "N" members of the data line selecting gates. When one of the lines extending from the data line selector is selected by the data line selector, the "N" main bit data lines are operatively connected to the "N" successive memory cells so that access to these memory cells is enabled. In this modification, the total number of the column selecting gates and the data line selecting gates is equal to $M+2N^2$. A prior art design has corresponding gates, the total number is equal to $N \times M$. The following function f(N,M) is now introduced.

$$f(N,M) = N \times M - M - 2N^2 \quad (1)$$

It is preferable that the numbers N and M are chosen so as to make the value f(N,M) positive.

Figure 9:
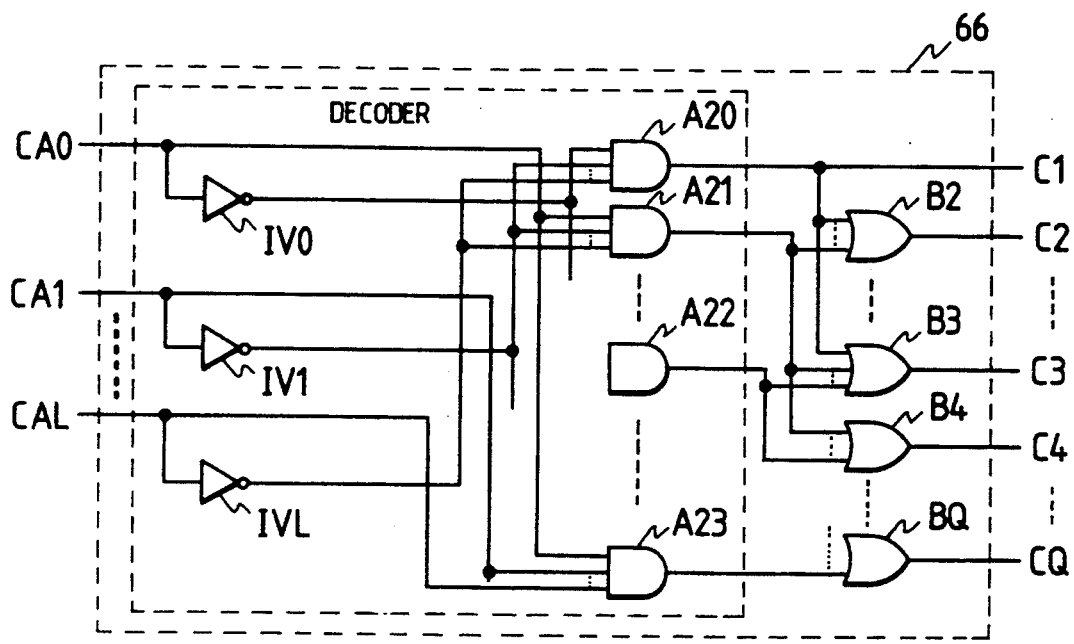
FIG. 9 is a block diagram of the column selector of FIG. 4.

The column selector 66 operates in response to a column address signal having L+1 bits CA0, CA1, ..., CAL, where L denotes a given natural number. As shown in FIG. 9, the column selector 66 includes a combination of inverters IV0, ..., IVL, AND gates A20, ..., A23, and OR gates B2, ..., BQ. The inverters IV0, ..., IVL, and the AND gates A20, ..., A23 compose a column address decoder receiving the bits CA0, CA1, ..., CAL of the column address signal. The OR gates B2, ..., BQ are connected between the AND gates AND gates A20, ..., A23 and the column selection lines C2, ..., CQ. The output terminal of the AND gate A1 is directly connected to the column selection line C1. When the column address signal represents a decimal number (address) of 0, only the AND gate A20 within the column address decoder outputs a high-level signal so that the "P/3" successive column selection lines C1, C2, and C3 are selected and activated. When the column address signal represents a decimal number (address) of 1, only the AND gate A21 within the column address decoder outputs a high-level signal so that the "P/3" successive column selection lines C2, C3, and C4 are selected and activated. In such a way, only one of the AND gates A20, ..., A23 outputs a high-level signal so that the "P/3" successive members of the column selection lines C1, ..., CQ are selected and activated in response to the column address signal.

Figure 10:
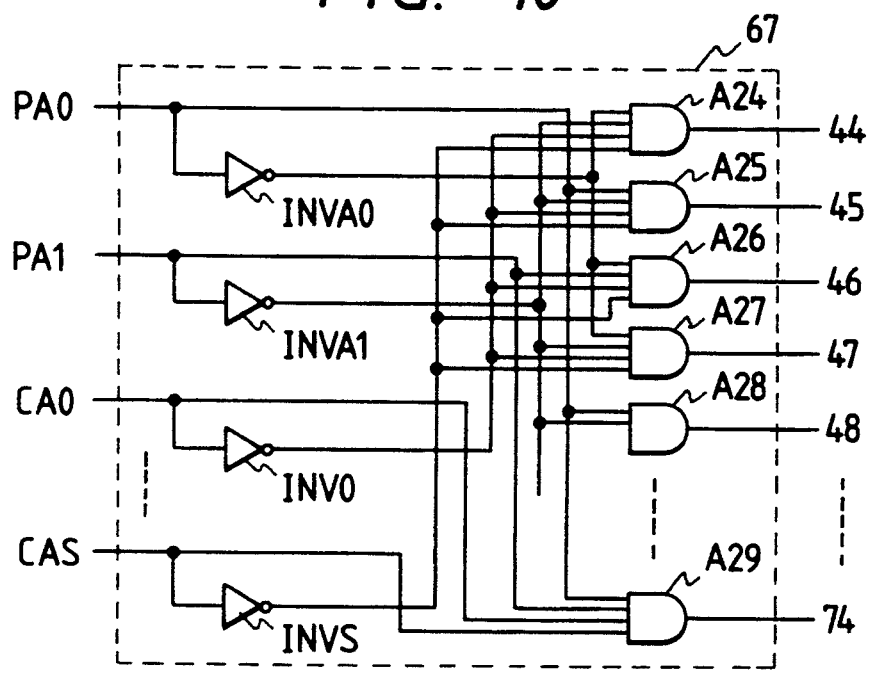
FIG. 10 is a block diagram of the data line selector of FIG. 4.

The data line selector 67 operates in response to bits PA0 and PA1 of an address signal representing the position of a pixel head, and in response to the lower bits CA0, ..., CAS of the column address signal, where S denotes a given natural number equal to or smaller than the natural number L. The data line selector 67 is composed of an address decoder. As shown in FIG. 10, the data line selector 67 includes a combination of inverters INVA0, INVA1, INV0, ..., INVS, and AND gates A24, ..., A29 which receive the address signal bits PA0, PA1, CA0, ..., CAS. The output terminals of the AND gates A24, ..., A29 are connected to the lines 44–49 and 72–74 respectively. When the address signal bits CA0, ..., CAS represent a decimal number (address) of 0 and both the address signal bits PA0 and PA1 represent "0", only the AND gate A24 outputs a high-level signal so that the line 44 is selected. When the address signal bits CA0, ..., CAS represent a decimal number (address) of 0 and the address signal bits PA0 and PA1 represent "1" and "0" respectively, only the AND gate A25 outputs a high-level signal so that the line 45 is selected. When the address signal bits CA0, ..., CAS represent a decimal number (address) of 0 and the address signal bits PA0 and PA1 represent "0" and "1" respectively, only the AND gate A26 outputs a high-level signal so that the line 46 is selected. When the address signal bits CA0, ..., CAS represent a decimal number (address) of 1 and both the address signal bits PA0 and PA1 represent "0", only the AND gate A27 outputs a high-level signal so that the line 47 is selected. In such a way, only one of the AND gates A24, ..., A29 outputs a high-level signal so that only one of the lines 44–49 and 72–74 is selected in response to the address signal bits PA0, PA1, CA0, ..., CAS.

DESCRIPTION OF THE SECOND PREFERRED EMBODIMENT

Figure 5:
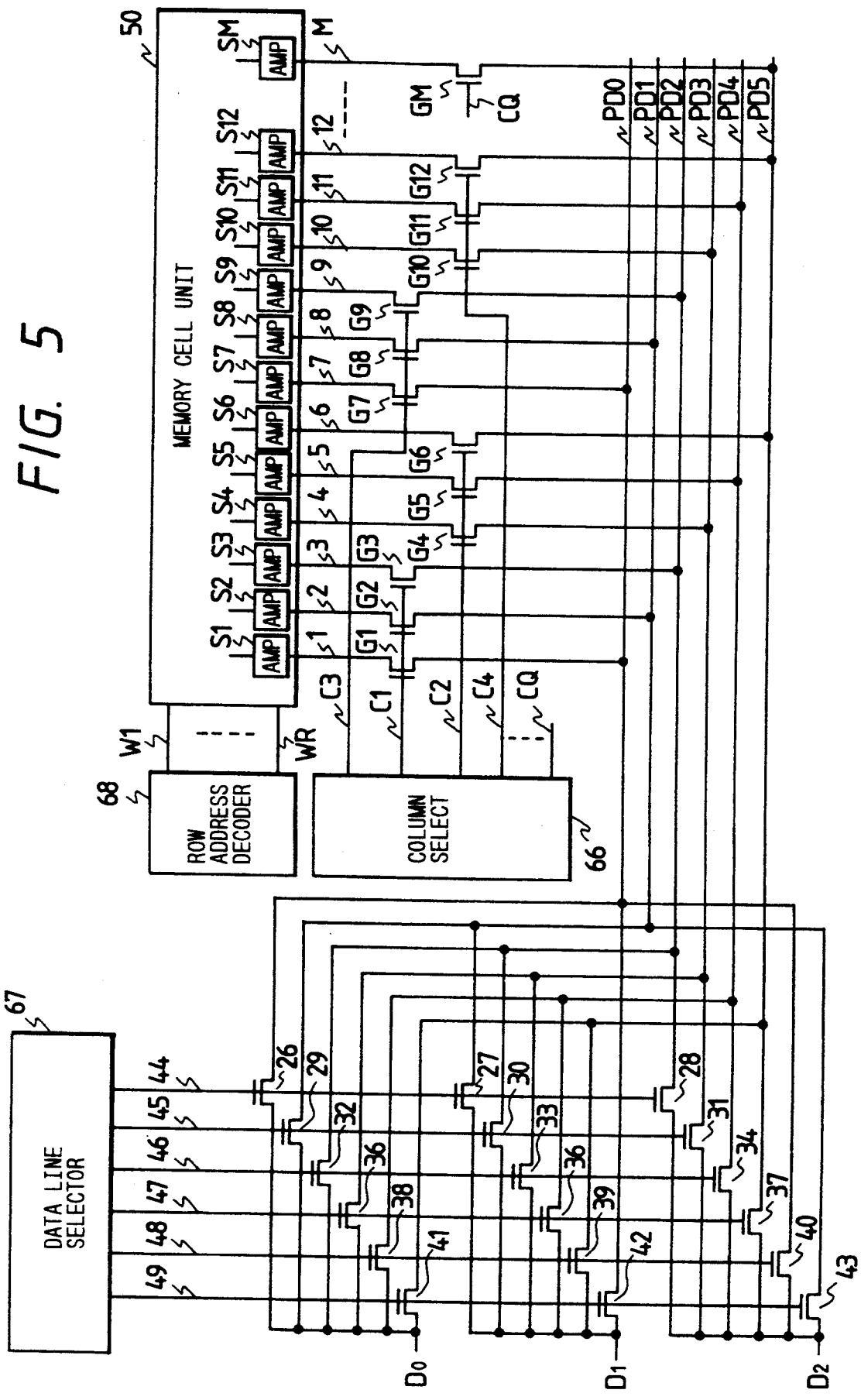
FIG. 5 is a diagram of a memory according to a second embodiment of this invention.

With reference to FIG. 5, a memory of a second embodiment of this invention includes a memory cell unit 50 composed of an array of memory cells and a set of sense amplifiers S1, S2, ..., SM. The letter M denotes a predetermined natural number. Bit lines 1, 2, ..., M extend from the sense amplifiers S1, S2, ..., SM in the memory cell unit 50 respectively. The bit lines 1, ..., M are connected to the memory cells in the memory cell unit 50 via the sense amplifiers S1, ..., SM. Word lines W1, ..., WR extend between the memory cell unit 50 and a row address decoder 68. The letter R denotes a preset natural number. The word lines W1, ..., WR are connected to the memory cells in the memory cell unit 50.

A multi-bit data line has three bits which correspond to main bit data lines D0, D1, and D2 respectively. There are sub bit data lines (pre-data lines) PD0, PD1, PD2, PD3, PD4, and PD5, the number of which is equal to a half of the number of the main bit data lines D0, D1, and D2. The bit lines 1, 2, ..., M are separated into groups each having six successive bit lines. The bit lines 1, 2, ..., 6 in a first group are connected to the sub bit data lines PD0, PD1, ..., PD5 via column selecting gates G1, G2, ..., G6 respectively. The bit lines 7, 8, ..., 12 in a second group are connected to the sub bit data lines PD0, PD1, ..., PD5 via column selecting gates G7, G8, ..., G12 respectively. Similarly, the remaining bit lines 13, ..., M in third and later groups are connected to the sub bit data lines PD0, PD1, ..., PD5 via column selecting gates G13, ..., GM.

The column selecting gates G1, ..., GM are separated into groups each having three successive column selecting gates. The control electrodes of the column selecting gates G1, G2, and G3 in a first group are connected in common to a column selection line C1 extending from a column selector 66. The control electrodes of the column selecting gates G4, G5, and G6 in a second group are connected in common to a column selection line C2 extending from the column selector 66. Similarly, the control electrodes of the remaining column selecting gates G7, ..., GM in third and later groups are connected to column selection lines C3, ..., CQ extending from the column selector 66. The letter Q denotes a predetermined natural number equal to one third of the number M.

The sub bit data line PD0 is connected to the main bit data lines D0, D1, and D2 via data line selecting gates 26, 27, and 28 respectively. The sub bit data line PD1 is connected to the main bit data lines D0, D1, and D2 via data line selecting gates 29, 30, and 31 respectively. The sub bit data line PD2 is connected to the main bit data lines D0, D1, and D2 via data line selecting gates 32, 33, and 34 respectively. The sub bit data line PD3 is connected to the main bit data lines D0, D1, and D2 via data line selecting gates 35, 36, and 37 respectively. The sub bit data line PD4 is connected to the main bit data lines D0, D1, and D2 via data line selecting gates 38, 39, and 40 respectively. The sub bit data line PD5 is connected to the main bit data lines D0, D1, and D2 via data line selecting gates 41, 42, and 43 respectively.

The control electrodes of the data line selecting gates 26, 27, and 28 are connected in common to a line 44 extending from a data line selector 67. The control electrodes of the data line selecting gates 29, 30, and 31 are connected in common to a line 45 extending from the data line selector 67. The control electrodes of the data line selecting gates 32, 33, and 34 are connected in common to a line 46 extending from the data line selector 67. The control electrodes of the data line selecting gates 35, 36, and 37 are connected in common to a line 47 extending from the data line selector 67. The control electrodes of the data line selecting gates 38, 39, and 40 are connected in common to a line 48 extending from the data line selector 67. The control electrodes of the data line selecting gates 41, 42, and 43 are connected in common to a line 49 extending from the data line selector 67.

The row address decoder 68 selects and activates one of the word lines W1, ..., WR in response to a row address signal. When one of the word lines W1, ..., WR is selected by the row address decoder 68, memory cells within the memory cell unit 50 which are provided on the selected word line are operatively connected to the bit lines 1, ..., M respectively. Thus, access to the memory cells within the memory cell unit 50 which are connected to the selected word line is enabled.

In general, the column selector 66 selects and activates two successive members of the column selection lines C1, ..., CQ in response to a column address signal. When two successive members of the column selection lines C1, ..., CQ are selected by the column selector 66, six successive members of the column selecting gates G1, ..., GM which are connected to the selected column selection lines are made conductive. Thus, six successive members of the bit lines 1, ..., M which lead to the conductive column selecting gates are operatively connected to the sub bit data lines PD0, . . . , PD5. For example, when the column selection lines C1 and C2 are selected by the column selector 66, the column selecting gates G1, G2, G3, G4, G5, and G6 are made conductive so that the bit lines 1, 2, 3, 4, 5, and 6 are operatively connected to the sub bit data lines PD0, PD1, PD2, PD3, PD4, and PD5 respectively.

The data line selector 67 selects and activates one of the lines 44, . . . , 49 in response to a column address signal. When one of the lines 44, . . . , 49 is selected by the data line selector 67, three members of the data line selecting gates 26, . . . , 43 which are connected to the selected line are made conductive. Thus, three members of the sub bit data lines PD0, . . . , PD5 which lead to the conductive data line selecting gates are operatively connected to the main bit data lines D0, D1, and D2. For example, the line 44 is selected by the data line selector 67, the data line selecting gates 26, 27, and 28 are made conductive so that the sub bit data lines PD0, PD1, and PD2 are operatively connected to the main bit data lines D0, D1, and D2 respectively.

Figure 6:
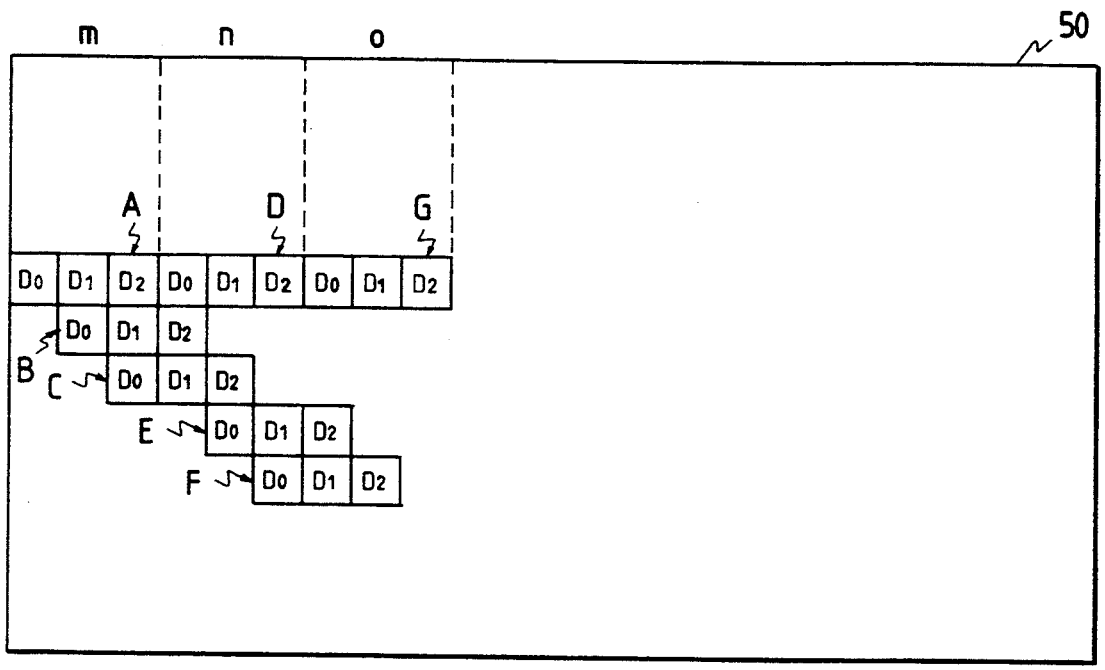
FIG. 6 is an address map of the memory cell unit in the memory of FIG. 5.

The operation of the memory of FIG. 5 will be described with reference to FIG. 6. As understood from FIG. 5, the column selecting gates G1, . . . , GM are separated into groups each having three successive column selecting gates. The memory cells in the memory cell unit 50 are separated into groups in accordance with the separation of the column selecting gates G1, . . . , GM into groups. In FIG. 6, longitudinal broken lines denote the boundaries between the memory cell groups in the memory cell unit 50. In the case where access to three bits (three memory cells) in a bit block A within the memory cell unit 50 is required (see FIG. 6), the row address decoder 68 selects and activates specified one of the word lines W1, . . . , WR which corresponds to the row address of the bit block A. Thus, memory cells within the memory cell unit 50 which are provided on the selected word line are operatively connected to the bit lines 1, . . . , M respectively. In addition, the column selector 66 selects and activates the column selection lines C1 and C2 so that the column selecting gates G1, G2, G3, G4, G5, and G6 are made conductive. Thus, the bit lines 1, 2, 3, 4, 5, and 6 are operatively connected to the sub bit data lines PD0, PD1, PD2, PD3, PD4, and PD5 respectively. The data line selector 67 selects and activates the line 44 so that the data line selecting gates 26, 27, and 28 are made conductive. Thus, the sub bit data lines PD0, PD1, and PD2 are operatively connected to the main bit data lines D0, D1, and D2 respectively. As a result, the bit lines 1, 2, and 3 are operatively connected to the main bit data lines D0, D1, and D2 respectively.

In the case where access to three bits (three memory cells) in a bit block B within the memory cell unit 50 is required (see FIG. 6), the row address decoder 68 selects and activates specified one of the word lines W1, . . . , WR which corresponds to the row address of the bit block B. Thus, memory cells within the memory cell unit 50 which are provided on the selected word line are operatively connected to the bit lines 1, . . . , M respectively. In addition, the column selector 66 selects and activates the column selection lines C1 and C2 so that the column selecting gates G1, G2, G3, G4, G5, and G6 are made conductive. Thus, the bit lines 1, 2, 3, 4, 5, and 6 are operatively connected to the sub bit data lines PD0, PD1, PD2, PD3, PD4, and PD5 respectively. The data line selector 67 selects and activates the line 45 so that the data line selecting gates 29, 30, and 31 are made conductive. Thus, the sub bit data lines PD1, PD2, and PD3 are operatively connected to the main bit data lines D0, D1, and D2 respectively. As a result, the bit lines 2, 3, and 4 are operatively connected to the main bit lines D0, D1, and D2 respectively.

In the case where access to three bits (three memory cells) in a bit block C within the memory cell unit 50 is required (see FIG. 6), the row address decoder 68 selects and activates specified one of the word lines W1, . . . , WR which corresponds to the row address of the bit block C. Thus, memory cells within the memory cell unit 50 which are provided on the selected word line are operatively connected to the bit lines 1, . . . , M respectively. In addition, the the column selector 66 selects and activates the column selection lines C1 and C2 so that the column selecting gates G1, G2, G3, G4, G5, and G6 are made conductive. Thus, the bit lines 1, 2, 3, 4, 5, and 6 are operatively connected to the sub bit data lines PD0, PD1, PD2, PD3, PD4, and PD5 respectively. The data line selector 67 selects and activates the line 46 so that the data line selecting gates 32, 33, and 34 are made conductive. Thus, the sub bit data lines PD2, PD3, and PD4 are operatively connected to the main bit data lines D0, D1, and D2 respectively. As a result, the bit lines 3, 4, and 5 are operatively connected to the main bit data lines D0, D1, and D2 respectively.

In the case where access to three bits (three memory cells) in a bit block D within the memory cell unit 50 is required (see FIG. 6), the row address decoder 68 selects and activates specified one of the word lines W1, . . . , WR which corresponds to the row address of the bit block D. Thus, memory cells within the memory cell unit 50 which are provided on the selected word line are operatively connected to the bit lines 1, . . . , M respectively. In addition, the the column selector 66 selects and activates the column selection lines C2 and C3 so that the column selecting gates G4, G5, G6, G7, G8, and G9 are made conductive. Thus, the bit lines 4, 5, 6, 7, 8, and 9 are operatively connected to the sub bit data lines PD3, PD4, PD5, PD0, PD1, and PD2 respectively. The data line selector 67 selects and activates the line 47 so that the data line selecting gates 35, 36, and 37 are made conductive. Thus, the sub bit data lines PD3, PD4, and PD5 are operatively connected to the main bit data lines D0, D1, and D2 respectively. As a result, the bit lines 4, 5, and 6 are operatively connected to the main bit data lines D0, D1, and D2 respectively.

In the case where access to three bits (three memory cells) in a bit block E within the memory cell unit 50 is required (see FIG. 6), the row address decoder 68 selects and activates specified one of the word lines W1, . . . , WR which corresponds to the row address of the bit block E. Thus, memory cells within the memory cell unit 50 which are provided on the selected word line are operatively connected to the bit lines 1, . . . , M respectively. In addition, the the column selector 66 selects and activates the column selection lines C2 and C3 so that the column selecting gates G4, G5, G6, G7, G8, and G9 are made conductive. Thus, the bit lines 4, 5, 6, 7, 8, and 9 are operatively connected to the sub bit data lines PD3, PD4, PD5, PD0, PD1, and PD2 respectively. The data line selector 67 selects and activates the line 48 so that the data line selecting gates 38, 39, and 40 are made conductive. Thus, the sub bit data lines PD4, PD5, and PD0 are operatively connected to the main bit data lines D0, D1, and D2 respectively. As a result, the bit lines 5, 6, and 7 are operatively connected to the main bit lines D0, D1, and D2 respectively.

In the case where access to three bits (three memory cells) in a bit block F within the memory cell unit 50 is required (see FIG. 6), the row address decoder 68 selects and activates specified one of the word lines W1, ..., WR which corresponds to the row address of the bit block F. Thus, memory cells within the memory cell unit 50 which are provided on the selected word line are operatively connected to the bit lines 1, ..., M respectively. In addition, the the column selector 66 selects and activates the column selection lines C2 and C3 so that the column selecting gates G4, G5, G6, G7, G8, and G9 are made conductive. Thus, the bit lines 4, 5, 6, 7, 8, and 9 are operatively connected to the sub bit data lines PD3, PD4, PD5, PD0, PD1, and PD2 respectively. The data line selector 67 selects and activates the line 49 so that the data line selecting gates 41, 42, and 43 are made conductive. Thus, the sub bit data lines PD5, PD0, and PD1 are operatively connected to the main bit data lines D0, D1, and D2 respectively. As a result, the bit lines 6, 7, and 8 are operatively connected to the main bit lines D0, D1, and D2 respectively.

In the case where access to three bits (three memory cells) in a bit block G within the memory cell unit 50 is required (see FIG. 6), the row address decoder 68 selects and activates specified one of the word lines W1, ..., WR which corresponds to the row address of the bit block G. Thus, memory cells within the memory cell unit 50 which are provided on the selected word line are operatively connected to the bit lines 1, ..., M respectively. In addition, the the column selector 66 selects and activates the column selection lines C3 and C4 so that the column selecting gates G7, G8, G9, G10, G11, and G12 are made conductive. Thus, the bit lines 7, 8, 9, 10, 11, and 12 are operatively connected to the sub bit data lines PD0, PD1, PD2, PD3, PD4, and PD5 respectively. The data line selector 67 selects and activates the line 44 so that the data line selecting gates 26, 27, and 28 are made conductive. Thus, the sub bit data lines PD0, PD1, and PD2 are operatively connected to the main bit data lines D0, D1, and D2 respectively. As a result, the bit lines 7, 8, and 9 are operatively connected to the main bit data lines D0, D1, and D2 respectively.

Figure 11:
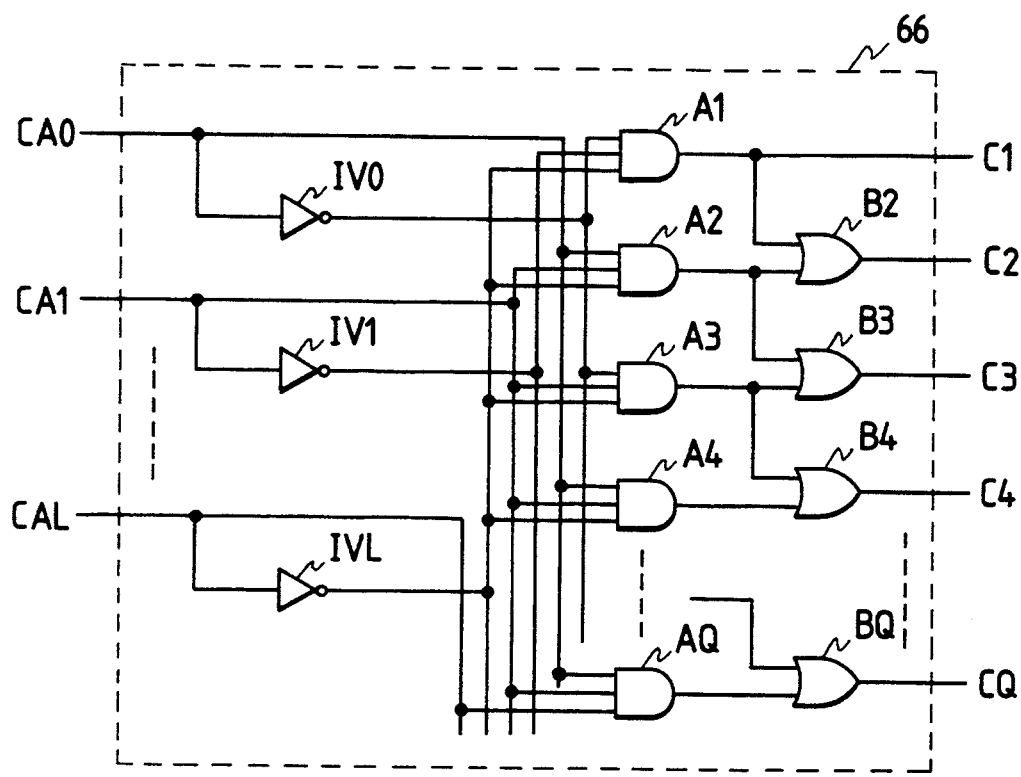
FIG. 11 is a block diagram of the column selector of FIG. 5.

The column selector 66 operates in response to a column address signal having L+1 bits CA0, CA1, ..., CAL, where L denotes a given natural number. As shown in FIG. 11, the column selector 66 includes a combination of inverters IV0, ..., IVL, AND gates A1, ..., AQ, and OR gates B2, ..., BQ. The inverters IV0, ..., IVL, and the AND gates A1, ..., AQ compose a column address decoder receiving the bits CA0, CA1, ..., CAL of the column address signal. The OR gates B2, ..., BQ are connected between the AND gates AND gates A1, ..., AQ and the column selection lines C2, ..., CQ. The output terminal of the AND gate A1 is directly connected to the column selection line C1. When the column address signal represents a decimal number (address) of 0, only the AND gate A1 within the column address decoder outputs a high-level signal so that the OR gate B2 also outputs a high-level signal and thus the successive column selection lines C1 and C2 are selected and activated. When the column address signal represents a decimal number (address) of 1, only the AND gate A2 within the column address decoder outputs a high-level signal so that the OR gates B2 and B3 also output high-level signals and thus the successive column selection lines C2 and C3 are selected and activated. When the column address signal represents a decimal number (address) of 2, only the AND gate A3 within the column address decoder outputs a high-level signal so that the OR gates B3 and B4 also output high-level signals and thus the successive column selection lines C3 and C4 are selected and activated. In such a way, only one of the AND gates A1, ..., AQ outputs a high-level signal so that the two successive members of the column selection lines C1, ..., CQ are selected and activated in response to the column address signal.

Figure 12:
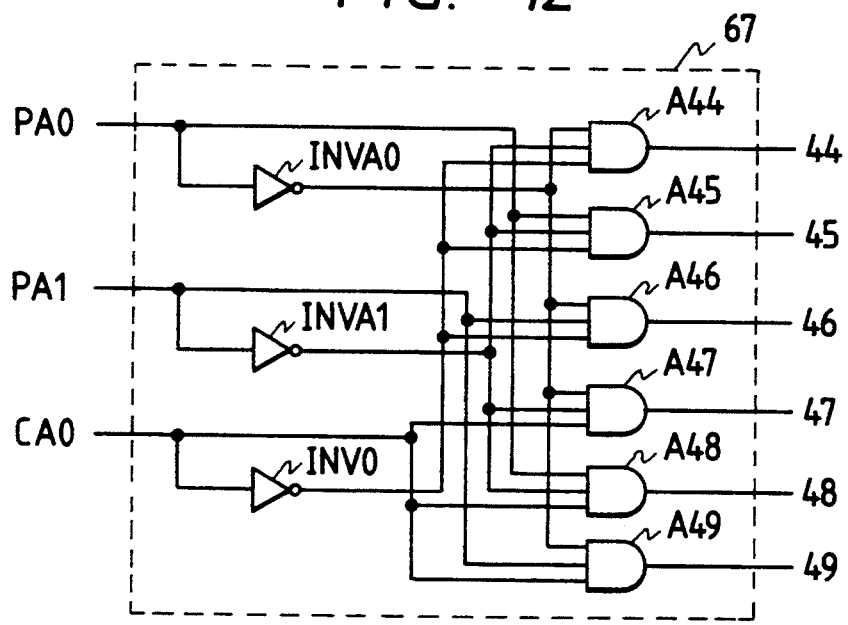
FIG. 12 is a block diagram of the data line selector of FIG. 5.

The data line selector 67 operates in response to bits PA0 and PA1 of an address signal representing the position of a pixel head, and in response to the lowest bit CA0 of the column address signal. The data line selector 67 is composed of an address decoder. As shown in FIG. 12, the data line selector 67 includes a combination of inverters INVA0, INVA1, and INV0, and AND gates A44, ..., A49 which receive the address signal bits PA0, PA1, and CA0. The output terminals of the AND gates A44, ..., A49 are connected to the lines 44-49 respectively. When the address signal bit CA0 represents "0" and both the address signal bits PA0 and PA1 represent "0", only the AND gate A44 outputs a high-level signal so that the line 44 is selected. When the address signal bit CA0 represents "0" and the address signal bits PA0 and PA1 represent "1" and "0" respectively, only the AND gate A45 outputs a high-level signal so that the line 45 is selected. When the address signal bit represents "0" and the address signal bits PA0 and PA1 represent "0" and "1" respectively, only the AND gate A46 outputs a high-level signal so that the line 46 is selected. When the address signal bit CA0 represents a decimal number (address) of 1 and both the address signal bits PA0 and PA1 represent "0", only the AND gate A47 outputs a high-level signal so that the line 47 is selected. In such a way, only one of the AND gates A44, ..., A49 outputs a high-level signal so that only one of the lines 44-49 is selected in response to the address signal bits PA0, PA1, and CA0.

DESCRIPTION OF THE THIRD PREFERRED EMBODIMENT

Figure 7:
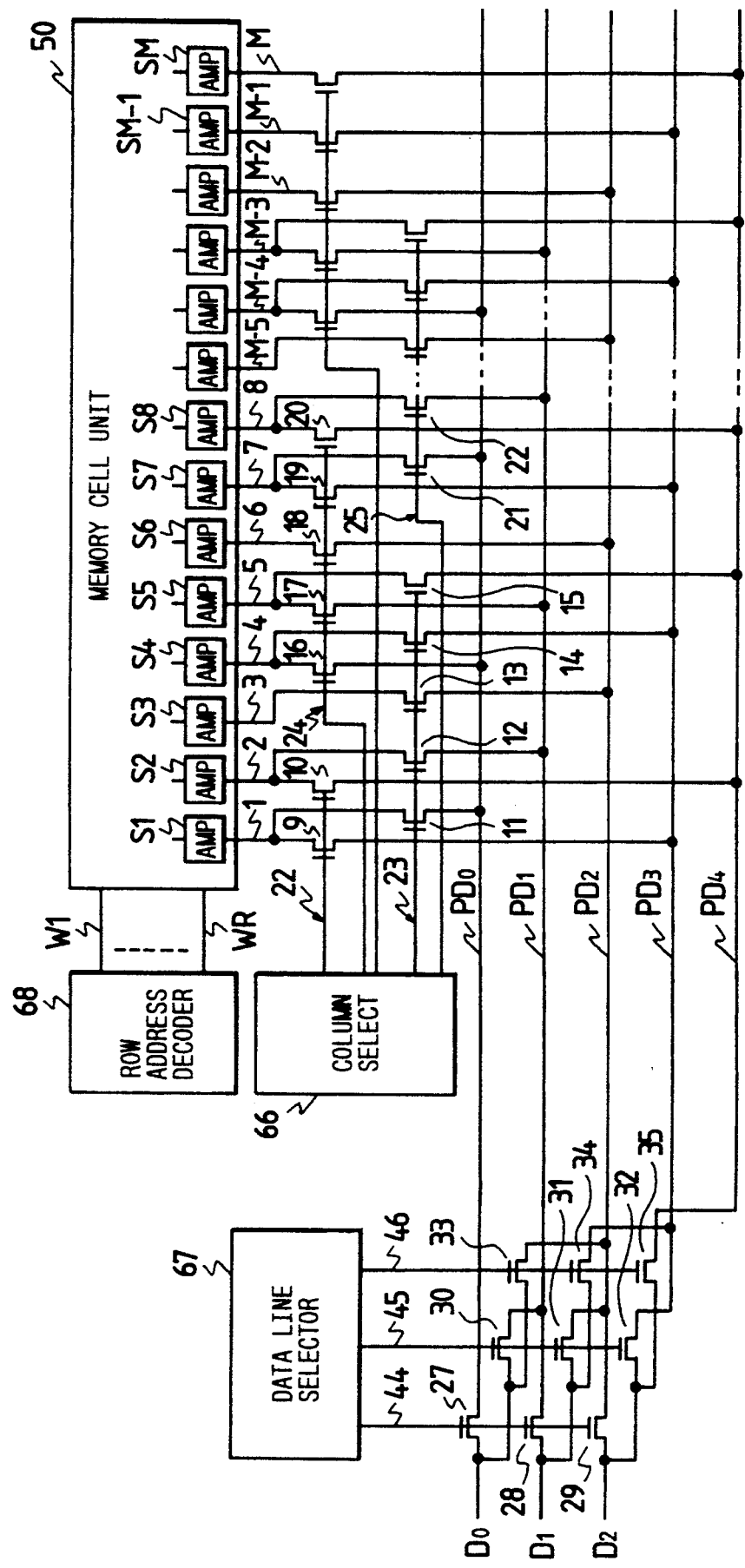
FIG. 7 is a diagram of a memory according to a third embodiment of this invention.

With reference to FIG. 7, a memory of a third embodiment of this invention includes a memory cell unit 50 composed of an array of memory cells and a set of sense amplifiers S1, S2, ..., SM. The letter M denotes a predetermined natural number. Bit lines 1, 2, ..., M extend from the sense amplifiers S1, S2, ..., SM in the memory cell unit 50 respectively. The bit lines 1, ..., W are connected to the memory cells in the memory cell unit 50 via the sense amplifiers S1, ..., SM. Word lines W1, ..., WR extend between the memory cell unit 50 and a row address decoder 68. The letter R denotes a preset natural number. The word lines W1, ..., WR are connected to the memory cells in the memory cell unit 50.

The row address decoder 68 selects and activates one of the word lines W1, ..., WR in response to a row address signal. When one of the word lines W1, ..., WR is selected by the row address decoder 68, memory cells within the memory cell unit 50 which are provided on the selected word line are operatively connected to the bit lines 1, ..., M respectively. Thus, access to the memory cells within the memory cell unit 50 which are connected to the selected word line is enabled.

A multi-bit data line has three bits which correspond to main bit data lines D0, D1, and D2 respectively. There are sub bit data lines (pre-data lines) PD0, PD1, PD2, PD3, and PD4, the number of which has a given relation with the number of the main bit data lines D0, D1, and D2. The bit lines 1, 2, ..., M are connected to the sub bit data lines PD0, PD1, PD2, PD3, and PD4 via column selecting gates 9, 10, ..., 22, .... The column selecting gates 9, 10, ..., 22, ... are separated into groups which are connected to a column selector 66 via column selection lines 23, 24, 25, .... When one of the column selection lines 23, 24, 25, ... is selected by the column selector 66 in response to a column address signal, successive five members of the column selecting gates 9, 10, ..., 22, ... which are connected to the selected column selection line are made conductive. Thus, five successive members of the bit lines 1, ..., M which lead to the conductive column selecting gates are operatively connected to the sub bit data lines PD0, PD1, PD2, PD3, and PD4. For example, when the column selection line 23 is selected by the column selector 66, the column selecting gates 11, 12, 13, 14, and 15 are made conductive so that the bit lines 1, 2, 3, 4, and 5 are operatively connected to the sub bit data lines PD0, PD1, PD2, PD3, and PD4 respectively.

The sub bit data line PD0 is connected to the main bit data line D0 via a data line selecting gate 27. The sub bit data line PD1 is connected to the main bit data lines D0 and D1 via data line selecting gates 30 and 28 respectively. The sub bit data line PD2 is connected to the main bit data lines D0, D1, and D2 via data line selecting gates 33, 31, and 29 respectively. The sub bit data line PD3 is connected to the main bit data lines D1 and D2 via data line selecting gates 34 and 32 respectively. The sub bit data line PD4 is connected to the main bit data line D2, via a data line selecting gate 35.

The data line selecting gates 27, 28, and 29 are connected in common to a line 44 extending from a data line selector 67. The data line selecting gates 30, 31, and 32 are connected in common to a line 45 extending from the data line selector 67. The data line selecting gates 33, 34, and 35 are connected in common to a line 46 extending from the data line selector 67.

The data line selector 67 selects and activates one of the lines 44, 45, and 46 in response to a column address signal. When one of the lines 44, 45, and 46 is selected by the data line selector 67, three members of the data line selecting gates 27-35 which are connected to the selected line are made conductive. Thus, three members of the sub bit data lines PD0, PD1, PD2, PD3, and PD4 which lead to the conductive data line selecting gates are operatively connected to the main bit data lines D0, D1, and D2. For example, when the line 44 is selected by the data line selector 67, the data line selecting gates 27, 28, and 29 are made conductive so that the sub bit data lines PD0, PD1, and PD2 are operatively connected to the main bit data lines D0, D1, and D2 respectively.

Figure 8:
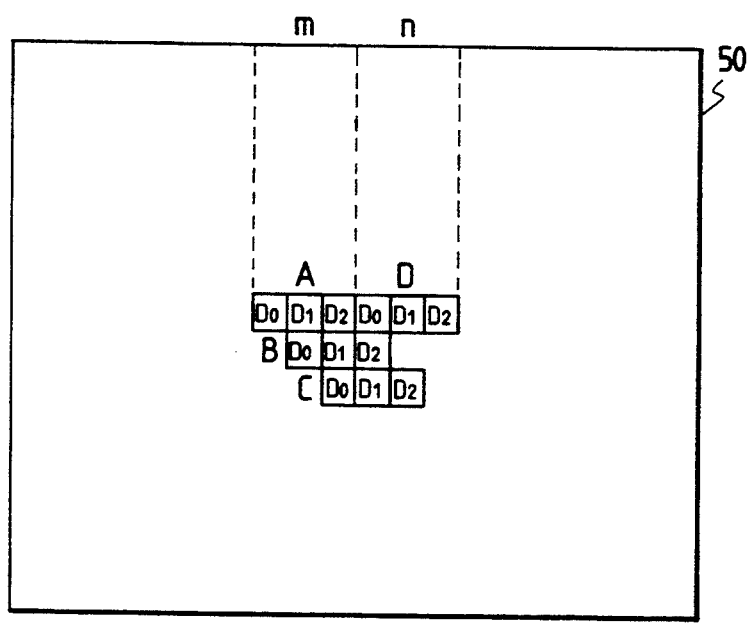
FIG. 8 is an address map of the memory cell unit in the memory of FIG. 7.

The operation of the memory of FIG. 7 will be described with reference to FIG. 8. In the case where access to three bits (three memory cells) in a bit block A within the memory cell unit 50 is required (see FIG. 8), the row address decoder 68 selects and activates specified one of the word lines W1, ..., WR which corresponds to the row address of the bit block A. Thus, memory cells within the memory cell unit 50 which are provided on the selected word line are operatively connected to the bit lines 1, ..., M respectively. In addition, the the column selector 66 selects and activates the column selection line 23 so that the column selecting gates 11, 12, 13, 14, and 15 are made conductive. Thus, the bit lines 1, 2, 3, 4, and 5 are operatively connected to the sub bit data lines PD0, PD1, PD2, PD3, and PD4 respectively. The data line selector 67 selects and activates the line 44 so that the data line selecting gates 27, 28, and 29 are made conductive. Thus, the sub bit data lines PD0, PD1, and PD2 are operatively connected to the main bit data lines D0, D1, and D2 respectively. As a result, the bit lines 1, 2, and 3 are operatively connected to the main bit data lines D0, D1, and D2 respectively.

In the case where access to three bits (three memory cells) in a bit block B within the memory cell unit 50 is required (see FIG. 8), the row address decoder 68 selects and activates specified one of the word lines W1, ..., WR which corresponds to the row address of the bit block B. Thus, memory cells within the memory cell unit 50 which are provided on the selected word line are operatively connected to the bit lines 1, ..., M respectively. In addition, the the column selector 66 selects and activates the column selection line 23 so that the column selecting gates 11, 12, 13, 14, and 15 are made conductive. Thus, the bit lines 1, 2, 3, 4, and 5 are operatively connected to the sub bit data lines PD0, PD1, PD2, PD3, and PD4 respectively. The data line selector 67 selects and activates the line 45 so that the data line selecting gates 30, 31, and 32 are made conductive. Thus, the sub bit data lines PD1, PD2, and PD3 are operatively connected to the main bit data lines D0, D1, and D2 respectively. As a result, the bit lines 2, 3, and 4 are operatively connected to the main bit data lines D0, D1, and D2 respectively.

In the case where access to three bits (three memory cells) in a bit block C within the memory cell unit 50 is required (see FIG. 8), the row address decoder 68 selects and activates specified one of the word lines W1, ..., WR which corresponds to the row address of the bit block C. Thus, memory cells within the memory cell unit 50 which are provided on the selected word line are operatively connected to the bit lines 1, ..., M respectively. In addition, the the column selector 66 selects and activates the column selection line 23 so that the column selecting gates 11, 12, 13, 14, and 15 are made conductive. Thus, the bit lines 1, 2, 3, 4, and 5 are operatively connected to the sub bit data lines PD0, PD1, PD2, PD3, and PD4 respectively. The data line selector 67 selects and activates the line 46 so that the data line selecting gates 33, 34, and 35 are made conductive. Thus, the sub bit data lines PD2, PD3, and PD4 are operatively connected to the main bit data lines D0, D1, and D2 respectively. As a result, the bit lines 3, 4, and 5 are operatively connected to the main bit data lines D0, D1, and D2 respectively.

In the case where access to three bits (three memory cells) in a bit block D within the memory cell unit 50 is required (see FIG. 8), the row address decoder 68 selects and activates specified one of the word lines W1, ..., WR which corresponds to the row address of the bit block D. Thus, memory cells within the memory cell unit 50 which are provided on the selected word line are operatively connected to the bit lines 1, ..., M respectively. In addition, the the column selector 66 selects and activates the column selection line 24 so that the column selecting gates 16, 17, 18, 19, and 20 are made conductive. Thus, the bit lines 4, 5, 6, 7, and 8 are operatively connected to the sub bit data lines PD0, PD1, PD2, PD3, and PD4 respectively. The data line selector 67 selects and activates the line 44 so that the data line selecting gates 27, 28, and 29 are made conductive. Thus, the sub bit data lines PD0, PD1, and PD2 are operatively connected to the main bit data lines D0, D1, and D2 respectively. As a result, the bit lines 4, 5, and 6 are operatively connected to the main bit data lines D0, D1, and D2 respectively.

The memory of FIG. 7 executes bit block transfer as follows. In the case where bit block transfer from the block (a) to the block (b) of FIG. 3 is required, the row address decoder 68 selects and activates specified one of the word lines W1, ..., WR which corresponds to the row address of the block (a). Thus, memory cells within the memory cell unit 50 which are provided on the selected word line are operatively connected to the bit lines 1, ..., M respectively. In addition, the the column selector 66 selects and activates the column selection line 23 so that the column selecting gates 11, 12, 13, 14, and 15 are made conductive. Thus, the bit lines 1, 2, 3, 4, and 5 are operatively connected to the sub bit data lines PD0, PD1, PD2, PD3, and PD4 respectively. The data line selector 67 selects and activates the line 45 so that the data line selecting gates 30, 31, and 32 are made conductive. Thus, the sub bit data lines PD1, PD2, and PD3 are operatively connected to the main bit data lines D0, D1, and D2 respectively. As a result, the bit lines 2, 3, and 4 are operatively connected to the main bit data lines D0, D1, and D2 respectively. Then, the data a1, a2, and a3 are read out from the first, second, and third memory cells in the block (a), being transmitted via the main bit data lines D0, D1, and D3 to a processing section (not shown) and being stored into the processing section. After the data a1, a2, and a3 are stored into the processing section, the row address decoder 68 selects and activates specified one of the word lines W1, ..., WR which corresponds to the row address of the block (b). Thus, memory cells within the memory cell unit 50 which are provided on the selected word line are operatively connected to the bit lines 1, ..., M respectively. In addition, the the column selector 66 selects and activates the column selection line 24 so that the column selecting gates 16, 17, 18, 19, and 20 are made conductive. Thus, the bit lines 4, 5, 6, 7, and 8 are operatively connected to the sub bit data lines PD0, PD1, PD2, PD3, and PD4 respectively. The data line selector 67 selects and activates the line 46 so that the data line selecting gates 33, 34, and 35 are made conductive. Thus, the sub bit data lines PD2, PD3, and PD4 are operatively connected to the main bit data lines D0, D1, and D2 respectively. As a result, the bit lines 6, 7, and 8 are operatively connected to the main bit data lines D0, D1, and D2 respectively. Then, the data b1, b2, and b3 are read out from the first, second, and third memory cells in the block (b), being transmitted via the main bit data lines D0, D1, and D3 to the processing section (not shown). The processing section executes given logic operation between the data a1 and the data b1, generating data c1 equal to the result of the logic operation. The processing section executes given logic operation between the data a2 and the data b2, generating data c2 equal to the result of the logic operation. The processing section executes given logic operation between the data a3 and the data b3, generating data c3 equal to the result of the logic operation. The data c1, c2, and c3 are outputted from the processing section, being transmitted via the main bit data lines D0, D1, and D2 and being written into the first, second, and third memory cells in the block (b).

Since the memory of FIG. 7 dispenses with a data shifting process during bit block transfer and related logic operation, the memory of FIG. 7 enables higher-speed data processing using bit block transfer.

It should be noted that the number of the main bit data lines may be different from three as will be explained hereinafter. A modification of the memory of FIG. 7 has main bit data lines, the number of which is equal to a predetermined natural number N other than three. In this modification, there are sub bit data lines, the number of which is equal to $(N \times 2 - 1)$. In addition, $N^2$ data line selecting gates are provided between the sub bit data lines and the main bit data lines.

Figure 13:
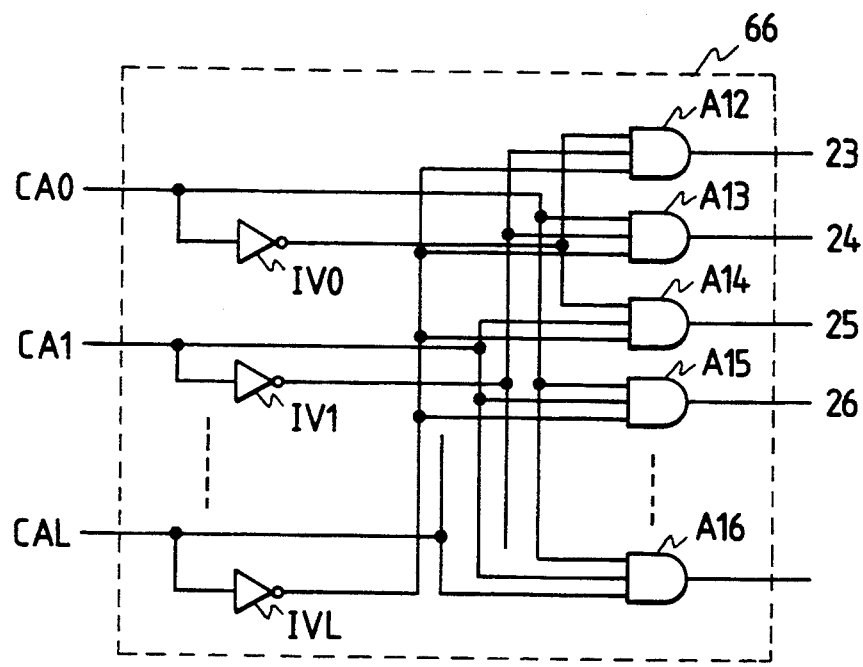
FIG. 13 is a block diagram of the column selector of FIG. 7.

The column selector 66 operates in response to a column address signal having $L+1$ bits CA0, CA1, ..., CAL, where L denotes a given natural number. As shown in FIG. 13, the column selector 66 includes a combination of inverters IV0, ..., IVL, and AND gates A12, ..., A16. The inverters IV0, ..., IVL, and the AND gates A12, ..., A16 compose a column address decoder receiving the bits CA0, CA1, ..., CAL of the column address signal. The output terminals of the AND gates A12, ..., A16 are connected to the column selection lines 23, 24, 25, ... respectively. When the column address signal represents a decimal number (address) of 0, only the AND gate A12 outputs a high-level signal so that the column selection line 23 is selected and activated. When the column address signal represents a decimal number (address) of 1, only the AND gate A13 outputs a high-level signal so that the column selection line 24 is selected and activated. When the column address signal represents a decimal number (address) of 2, only the AND gate A14 outputs a high-level signal so that the column selection line 25 is selected and activated. In such a way, only one of the AND gates A12, ..., A16 outputs a high-level signal so that one of the column selection lines 23, 24, 25, ... is selected and activated in response to the column address signal.

Figure 14:
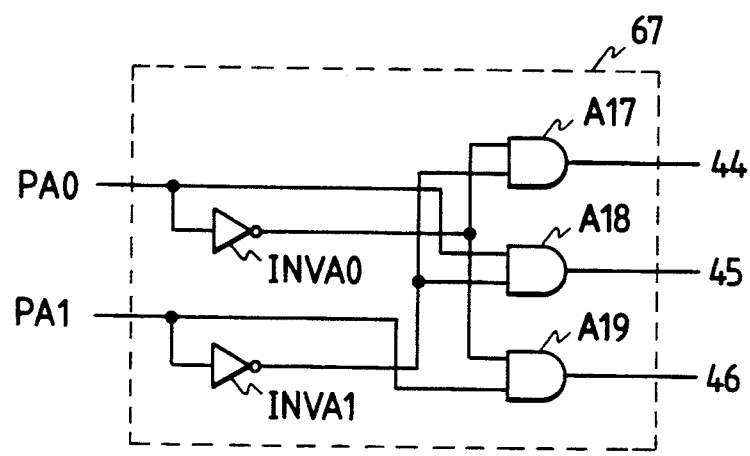
FIG. 14 is a block diagram of the data line selector of FIG. 7.

The data line selector 67 operates in response to bits PA0 and PA1 of an address signal representing the position of a pixel head. The data line selector 67 is composed of an address decoder. As shown in FIG. 14, the data line selector 67 includes a combination of inverters INVA0 and INVA1 and AND gates A17, A18, and A19 which receive the address signal bits PA0 and PA1. The output terminals of the AND gates A17, A18, and A19 are connected to the lines 44, 45, and 46 respectively. When both the address signal bits PA0 and PA1 represent "0", only the AND gate A17 outputs a high-level signal so that the line 44 is selected. When the address signal bits PA0 and PA1 represent "1" and "0" respectively, only the AND gate A18 outputs a high-level signal so that the line 45 is selected. When the address signal bits PA0 and PA1 represent "0" and "1" respectively, only the AND gate A19 outputs a high-level signal so that the line 46 is selected. In such a way, only one of the AND gates A17, A18, and A19 outputs a high-level signal so that only one of the lines 44, 45, and 46 is selected in response to the address signal bits PA0 and PA1.

What is claimed is:

1. A memory for pixel data bits derived from a multi-position pixel head comprising:
   N main data lines for the pixel data bits, where N denotes a given natural number greater than one;

a memory cell array unit;

a plurality of memory cell bit lines connected to the memory cell array unit;

a plurality of column selecting gates connected to the memory cell bit lines;

a plurality of ordered sub data lines, the number of sub data lines being greater than N;

a column selector for feeding the column selecting gates with a signal for simultaneously selecting a plurality of successively numbered sub data lines so that bits are simultaneously transferred between said successively numbered sub data lines and corresponding bit lines of the memory cell array unit, where the selected plurality of sub-data lines is at least N;

multiple data line selecting gates selectively feeding bits between the N main data lines and the plural sub data lines; and a data line selector responsive to a signal indicative of the pixel head position for controlling the data line selecting gates so bits are selectively simultaneously coupled between any of the N main data lines and at least N of the sub data lines.

2. A memory for pixel data bits derived from a multi-position pixel head comprising:

N main data lines for the pixel data bits, where N denotes a given natural number greater than one;

a memory cell array unit;

a plurality of memory cell bit lines connected to the memory cell array unit;

a plurality of column selecting gates connected to the memory cell bit lines;

2N ordered sub data lines;

a column selector for feeding the column selecting gates with a signal for simultaneously selecting 2N successively numbered sub data lines and corresponding bit lines of the memory cell array unit so that bits are simultaneously transferred between said successively numbered selected 2N sub data lines and corresponding bit lines of the memory cell array unit;

$2N^2$ data line selecting gates for selectively feeding bits between the N main data lines and the selected 2N sub data lines; and a data line selector responsive to a signal indicative of the pixel head position for controlling the data line selecting gates so bits are selectively simultaneously coupled between any of the N main data lines and the 2N sub data lines.

3. A memory for pixel data bits derived from a multi-position pixel head comprising:

N main data lines, where N denotes a given natural number greater than one;

a memory cell array unit;

a plurality of memory cell bit lines connected to the memory cell array unit;

a plurality of column selecting gates connected to the memory cell bit lines;

(2N−1) ordered sub data lines;

a column selector for feeding the column selecting gates with a signal for simultaneously selecting (2N−1) successive numbered sub data lines and corresponding bit lines of the memory cell array unit so that bits are simultaneously transferred between said successively numbered selected (2N−1) sub data lines and corresponding bit lines of the memory cell array unit;

multiple data line selecting gates selectively feeding bits between the N main data lines and the (2N−1) sub data lines; and a data line selector responsive to a signal indicative of the pixel head position for controlling the data line selecting gates so bits are selectively simultaneously coupled between any of the N main data lines and the (2N−1) sub data lines.

4. A memory comprising:

a memory cell array unit;

a plurality of ordered memory cell bit lines connected to the memory cell array unit, wherein the total number of the memory cell bit lines is equal to a given natural number greater than one;

a plurality of ordered sub data lines, wherein the total number of said sub data lines is equal to or smaller than the total number of the memory cell bit lines;

means for simultaneously selecting successively numbered members of the memory cell bit lines and for simultaneously connecting the selected successive numbered members of the memory cell bit lines and the sub data lines for selectively transmitting data bits between the selected successive members of the memory cell bit lines and the sub data lines;

a plurality of main data lines, the total number of the main data lines being smaller than the total number of the sub data lines; and means for simultaneously selecting successive members of the sub data lines in response to an address signal and for connecting the selected successive members of the sub data lines and the main data lines to enable simultaneous transmission of plural data bits between the simultaneously selected successive members of the sub data lines and the main data lines;

wherein the sub-data-line selecting means comprises means for connecting each of the selected successively numbered members of the sub data lines and any one of the main data lines in accordance with the address signal.

* * * * *